(12) United States Patent
Jayakumar et al.

(10) Patent No.: US 7,363,805 B2
(45) Date of Patent: Apr. 29, 2008

(54) SYSTEM FOR VIRTUAL PREDICTION OF ROAD LOADS

(75) Inventors: Paramsothy Jayakumar, Bloomfield Hills, MI (US); Marcello Berzeri, Birmingham, MI (US); Anil Dhir, Ann Arbor, MI (US); Bala Balendran, Bloomfield Hills, MI (US); R. Ranganathan, Ann Arbor, MI (US)

(73) Assignee: Ford Motor Company, Dearborn, MI (US)

( * ) Notice: Subject to any disclaimer, the term of this patent is extended or adjusted under 35 U.S.C. 154(b) by 202 days.

(21) Appl. No.: 11/241,353

(22) Filed: Sep. 30, 2005

(65) Prior Publication Data

US 2007/0074565 A1   Apr. 5, 2007

(51) Int. Cl.
*G01M 17/02*   (2006.01)

(52) U.S. Cl. .............................. 73/146; 702/140; 703/8

(58) Field of Classification Search ....... 73/146–146.5; 340/442–447; 703/1–8; 702/82, 140

See application file for complete search history.

(56) References Cited

U.S. PATENT DOCUMENTS

| | | | |
|---|---|---|---|
| 5,750,890 A | 5/1998 | Fricke et al. | |
| 5,900,542 A | 5/1999 | Fricke et al. | |
| 6,112,586 A | 9/2000 | Fricke et al. | |
| 6,134,957 A | 10/2000 | Fricke et al. | |
| 6,199,026 B1 * | 3/2001 | Shiraishi et al. | 702/140 |
| 6,223,114 B1 * | 4/2001 | Boros et al. | 701/70 |
| 6,247,348 B1 * | 6/2001 | Yamakado et al. | 73/11.04 |
| 6,338,270 B1 * | 1/2002 | Mancosu et al. | 73/146 |
| 6,741,957 B1 * | 5/2004 | Sui et al. | 703/8 |
| 6,754,615 B1 * | 6/2004 | Germann et al. | 703/8 |
| 6,761,060 B2 * | 7/2004 | Mancosu et al. | 73/146 |
| 7,149,670 B2 * | 12/2006 | Iwasaki et al. | 703/8 |

* cited by examiner

*Primary Examiner*—Andre J. Allen
*Assistant Examiner*—Jermaine Jenkins
(74) *Attorney, Agent, or Firm*—David B. Kelley; Tung & Associates (57) ABSTRACT

A system is provided for full-vehicle analytical road-loads prediction, which reduces the time and cost of modeling tires and tire-road interface, using road load simulations rather than actual measurements. The system includes a method to perform tire tests in a virtual environment, a road-load tire model for simulations in multibody environments; a tire model for FE simulations; and a comprehensive graphical user interface to support the user in all the steps of the analytical process.

20 Claims, 8 Drawing Sheets

$$\delta_y = \Delta_y/(1+\beta)$$
$$\gamma = \Delta_y/(R_o(1+\beta^{-1}))$$
$$\beta = (f_y/f_\gamma)^2 \cdot (m \cdot R_o^2/I_c)$$

TIRE-ROAD CONTACT IN 3D

SYSTEM FOR VIRTUAL PREDICTION OF ROAD LOADS

FIELD OF THE INVENTION

This invention generally relates to the design of vehicle systems, and deals more particularly with techniques used to design mechanical components and systems that are subject to road loads.

BACKGROUND OF THE INVENTION

Road loads are forces and moments acting at suspension, body and powertrain interface locations in vehicles. Accurate road loads are essential for the design and verification of vehicle durability performance. Road loads are typically measured by driving the vehicle over the proving ground surfaces specifically designed for testing vehicle durability, and taking measurements of the response of vehicle system components. These tests are costly and time-consuming as they require the development and fabrication of design-intent vehicle prototype and extensive instrumentation. Additionally, the processing of substantial amounts of measured data is quite time consuming. This time and labor intensive process is particularly disadvantageous during the prototyping stages of the vehicle design as the rapid feedback of performance information is vital to the design changes in the least amount of time.

Past attempts at predicting road loads using theoretical techniques have been less than completely successful. Analytical predictions of road loads are made difficult by the fact that tires undergo severe deformation while traveling over durability proving-ground surfaces. Existing tire models have been found to be inadequate, either because they are too simple (efficient but not accurate) or too complex (accurate but not efficient for computer simulations).

One known analytical technique for road load predictions uses the concept of a virtual tire testing strategy, based on an ETA/VPG generated tire model. VPG ("Virtual Proving Ground") is an integrated software package offered by Engineering Technology Associates, Inc., for the simulation and analysis of nonlinear dynamic problems such as durability and road load prediction. It uses software known as LS-DYNA which is a general purpose transient dynamic finite element program capable of simulating complex, real world problems. Using the software described above, an effective road profile is generated in a simulation (explicit analysis) environment, which is then utilized to predict behavior of simplified quarter car model. Examples of other analytical techniques used to model tire behavior are disclosed in U.S. Pat. Nos. 5,750,890; 5,900,543; 6,112,586; and 6,134,957, all of which are assigned to the assignee of the present invention.

Other commercially available tire models exist for simulating rough road loads for vehicles. The most commonly used tire models of this type include: MSC/ADAMS 2D and 3D tire models; MSC/F-tire model; LMS/CD Tire model; TNO/SWIFT model; and ETA/VPG model. Except for ETA/VPG tire model, the other above-mentioned models are used for simulation in multibody environment (e.g., ADAMS, DADS Software). These commercially available multibody dynamics simulation programs are used to simulate the dynamics of the multiple, interconnected rigid and flexible bodies found on vehicles. The behavior of the multibody system on the vehicle is described by the appropriate equations of motion, with emphasis on the vehicle's suspension system.

The VPG tire model is developed for vehicle simulations in FE (finite element) environment (e.g., DYNA Software). All of these tire models have been found to be inadequate in simulating durability loads for various reasons such as accuracy and computational time.

Accordingly, there is a need for a complete system for predicting rough road loads for full vehicle system. The present invention is intended to satisfy this need.

SUMMARY OF THE INVENTION

A system is provided for the simulation of vehicle-road interactions which significantly reduces time and cost of modeling tires and tire-road interface, and replaces hardware-based road load measurements with analytical predictions. The system includes: A method to perform tire tests in a virtual environment, termed Virtual Tire Lab (VTL); a tire model for full vehicle road load simulations in the multibody environment (e.g. ADAMS), termed as ARL_MBD; a tire model for full vehicle road load simulations in the finite-element (FE) environment (e.g. LS-DYNA), termed as ARL_FE; and a comprehensive GUI (graphical user interface) to support users in all steps of the analytical process. Although each of the components of the system can be used independently, the combination of these components can be advantageously used to provide a turn-key tool for analytical road load simulations.

The system allows for efficient and accurate analytical road load simulations using both finite-element and multibody codes. Further, the use of a virtual environment to generate tire test data eliminates the need for design-intent tire hardware for testing, thereby providing a considerable reduction of the time and costs required to perform tire testing. This virtual environment makes available the road load tire model parameters early in the vehicle development process, thus enabling early prediction of road loads. An important advantage of the system is that a complete process is provided by which an accurate durability tire model can be derived without any hardware testing.

According to one aspect of the invention, a method is provided for predicting road loads on vehicle components and systems, comprising the steps of producing a set of data defining preselected physical characteristics of a tire on the vehicle, generating an analytical model of the tire using the data set, and simulating road loads on the vehicle using the analytical tire model. The data set preferably comprises a finite element description of the tire. The analytical tire model is generated either by performing virtual tests on the tire, and recording responses to the virtual tests, or by using a simplified finite element description of the tire. The virtual tests are performed using nonlinear finite element simulations.

In accordance with one aspect of the invention, a method is provided for predicting road loads, comprising the steps of collecting data representing a plurality of physical characteristics of a tire, generating an analytical tire model using the collected data, and modeling responses of the full vehicle in conjunction with the tire model to a variety of road undulations.

In accordance with another aspect of the invention, a method is provided for generating a tire model for use in multibody simulations for vehicles, comprising the steps of producing a set of data defining preselected physical characteristics of the tire and, developing a set of analytical road load tire parameters describing the tire model, using virtual tire tests and the data set. The data set is preferably produced by generating a finite element description of the tire. The virtual tests are performed using nonlinear finite element simulations.

According to still another aspect of the invention, a method is provided for building a virtual road load model used in designing vehicles, comprising the steps of generating a virtual model of a vehicle tire having a set of known characteristics, modeling the response of the virtual model tire to a set of predetermined road conditions, and developing the road load model using the modeled response.

These non-limiting features, as well as other advantages of the present invention may be better understood by considering the following details of a description of a preferred embodiment of the present invention. In the course of this description, reference will frequently be made to the attached drawings.

DETAILED DESCRIPTION OF THE PREFERRED EMBODIMENT

The present invention relates to a system for analytical prediction of road-loads, useful in designing systems, subsystems and components of vehicles, whose function or performance is at least partially determined by road loads. The inventive system provides road load simulations without the need for design intent hardware or fixturing. Broadly, the system comprises the following functional modules: a method for performing virtual tire tests; a road load tire model, ARL_MBD, for simulations in multi-body dynamic (MBD) environment; a tire model, ARL_FE, for FE (finite element) simulations; and a comprehensive GUI (graphical user interface) to support a user in all steps of this analytical process. It should be noted here, that although each of these modules can be used independently of the others, the use of all of them in combination provides a turn-key tool for analytical road load simulations, sometimes hereinafter referred to as "road load tire".

The present road load tire system provides for efficient and accurate analytical road load simulations using both finite-element and multi-body dynamic codes. Additionally, the use of a virtual environment to generate tire test data eliminates the need for design-intent tire hardware for testing, thereby considerably reducing time and costs involved in testing tires. This virtual environment, sometimes referred to herein as a "virtual tire lab" or "VTL", makes available key road load tire model parameters early in the vehicle development process, thereby enabling early prediction of road loads. The system provides a complete process by which an accurate durability tire model can be derived without any hardware testing.

In order to accurately predict road loads, it is first necessary to understand and be able to predict the response of tires to varying road conditions. According to the present invention, a virtual tire modeling tool in the form of the VTL, is provided for obtaining tire properties such as static stiffness along the principal directions, tire modes, tire cornering stiffness, etc. These basic characteristics are then used to represent the behavior of the tire in the multi-body dynamic and finite-element simulations. The VTL includes a very detailed and comprehensive FE description of the tire (about 40,000 elements) typically provided by the tire manufacturer. This accurate description leads to high confidence in the simulation results obtained within the VTL.

Figure 1:
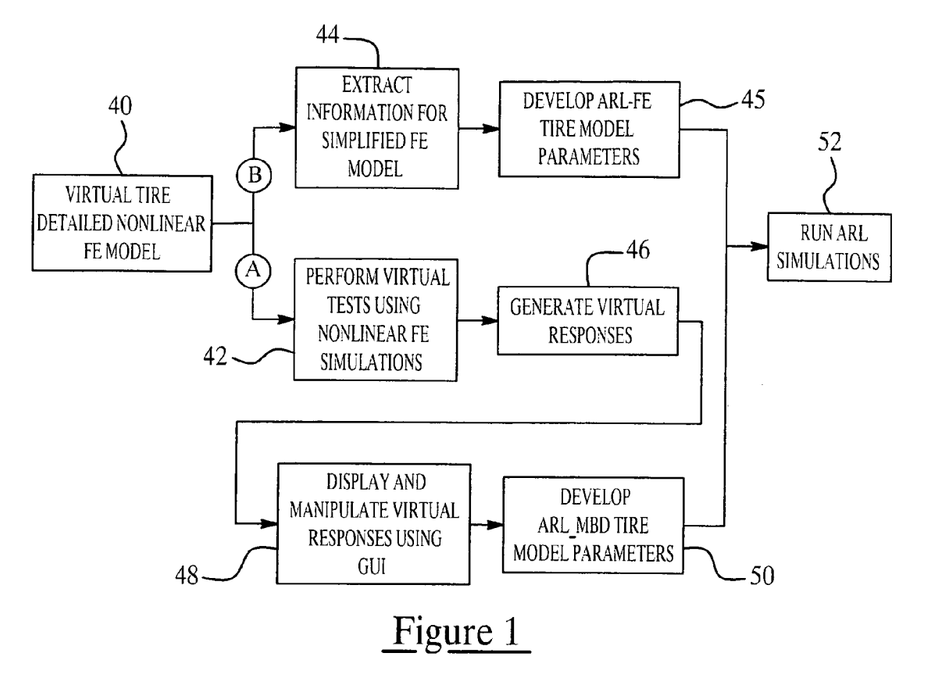
FIG. 1 is a block diagram showing the process steps in a method for predicting full vehicle road loads, which form the preferred embodiment of the invention.
Figure 2:
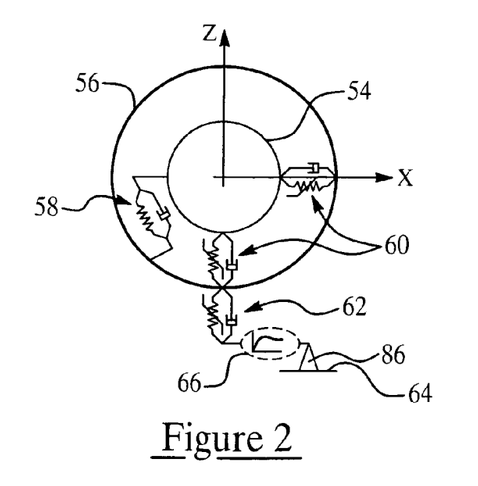
FIG. 2 is a schematic, in-plane representation of a vehicle wheel, illustrating the ARL_MBD tire model and its parameters.
Figure 3:
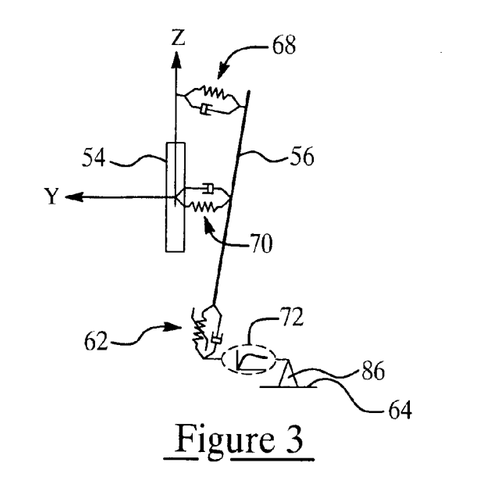
FIG. 3 is a schematic, out-of-plane representation of a vehicle wheel, also illustrating the ARL_MBD tire model and its parameters.

FIG. 1 shows how the VTL is used to develop analytical tire models (ARL_MBD and ARL_FE) that may then be used to simulate analytical road loads in conjunction with the full vehicle-road model. Starting from a non-linear detailed FE model either of two paths may be followed. The first path (indicated as path "A") employs a multibody-type tire model, ARL_MBD, while the second path (indicated as path "B") employs a simplified FE model, ARL_FE. In either case, the final goal of predicting road loads is achieved without the use of any hardware or prototype. As indicated above, a detailed and comprehensive finite-element (FE) model of a tire is first developed or obtained from the tire manufacturer, as shown at step 40. Using this model, virtual tire tests may be carried out using nonlinear FE simulations (path "A"), as shown at step 42. Alternatively, information can be extracted from the detailed tire model (path "B") to develop a simplified FE model, by performing the steps 44 and 45. The virtual tests performed in step 42 can be carried out using FE software such as that commercially available from ABAQUS, Inc., and include the following: tire mass and inertias calculation; modal frequency tests; three directional quasi-static flat-plate tests; vertical wedge tests; pure longitudinal slip tests; and pure lateral or side slip tests. These FE-based virtual tire tests generate a series of virtual responses, indicated at 46. These responses, which are displayed for the user using a GUI at 48, include the following:

1. Tire Mass & Inertias
2. Modal Frequencies
3. Contact Patch Lengths on Flat-Surface
4. Flat-surface quasi-static force-deflection data in X, Y & Z-directions
5. Wedge quasi-static force-deflection data in Z-direction
6. Flat-surface dynamic force-slip data in X-direction
7. Flat-surface dynamic Y-force & aligning moment vs. slip angle data In effect, these responses are used to define the parameters of the ARL_MBD tire model, at step 50. The ARL_MBD tire model is then integrated within a full vehicle-road model for the purpose of analytical road load simulation, at step 52. The ARL_MBD tire model parameters are schematically shown in FIGS. 2 and 3, and comprise the following:

1. Tire Ring Mass & Inertias
2. Nonlinear Static Stiffness Characteristics:
   Sidewall—Radial, Torsional, Lateral & Conical
   Tread—Nonlinear Radial
3. Nonlinear Dynamic Stiffness Characteristics:
   Tread Longitudinal Slip
   Tread Lateral or Side Slip In FIGS. 2 and 3, the tire is represented as a six degrees-of-freedom vibration system consisting of a tire (tread) circular ring 56, connected to a wheel rim 54 through the sidewall radial 60 (X & Z), lateral 70 (Y), torsional 58 (@X), and conical 68 (@Y & Z) springs/dampers. The tire ring 56 interfaces with rough ground undulations 86 in the road surface 64 through enveloping (tread or residual radial stiffness/damper 62), and slip phenomena (longitudinal slip and cornering stiffness, and friction 66 & 72).

In developing the ARL_MBD tire model for the multi-body dynamic simulations, it is important to consider the most influential factors and avoid unnecessary details. These factors are discussed below.

Tire dynamics is defined considering the tire rigid-body modes (i.e. the tread ring maintains its circular shape) in radial, torsional, lateral & conical/steering directions. Tire rigid-body modes are for the tire pre-loaded under a specified vertical design load with fixed hub boundary condition. Sidewall stiffness characteristics in radial, torsional, lateral and conical/steering directions are defined as non-linear to accommodate large deflections. Tire ring mass and inertias are estimated considering rigid-body modal frequencies and corresponding static tire stiffness (linear at the design load).

A tire enveloping a road undulation is modeled thru an accurate definition of the tire deflection shape. The tire model establishes full or partial contact across the tire width through a series of 2D tire slices. For each tire slice, an equivalent area-based radial deflection and its angular orientation within the tire plane are calculated. The radial or normal force acting within each slice is then evaluated as a nonlinear function of an "equivalent area-based deflection" and the "deflection shape-based tread radial stiffness". Once all the quantities within each slice have been evaluated, an equivalent center of contact and the resultant radial force vector are accurately determined within the tire contact patch. Additional radial force due to potential contact between bead/rim and road is also evaluated using the contact algorithms similar to the tire.

The tire model includes a detailed model for slip-induced longitudinal force, lateral force, and self-aligning moment. Longitudinal and side slip induced forces/moment are modeled considering tire-road friction (circle concept) and normal load dependent slip stiffness characteristics. Rolling-resistance is also taken into consideration. Slip force/moment are applied within the equivalent contact plane, where the center of contact is determined considering displaced contact patch.

The road model captures a detailed 3D description of rough road surfaces (potholes, random undulations, etc.). There are three models of varying complexities available to describe the road surface.

7 clearly-defined sets of tire data are used to define ARL_MBD tire model parameters. Clearly defined tire tests are used to obtain the required tire data sets, and a GUI is used to generate the simulation-ready model files from the raw data.

In developing the ARL_MBD Tire Model, the tire dynamics are characterized considering the first few tire rigid-body modes in radial, torsional, lateral and conical/steering directions. Tire rigid body modes imply that the tread ring maintains its circular shape, and are for the tire pre-loaded under a specified vertical design load with fixed hub boundary condition. Tire ring mass (m), torsional inertia (Is, @ Y-axis), and conical inertia (Ic, @ X- & Z-axis) inertias are estimated considering rigid-body modal frequencies in radial, torsional, and conical directions, respectively. Associated static stiffness values are linearized at the specified vertical design load.

As will now be discussed in detail, nonlinear characterization of sidewall stiffness is performed in various directions, including radial, torsional, lateral and conical.

Figure 4:
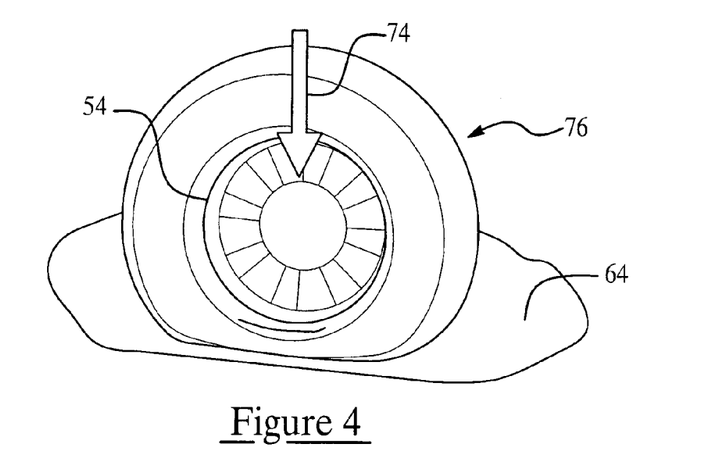
FIG. 4 is a diagrammatic view showing a quasi-static test set-up used to identify the nonlinear radial or vertical stiffness parameters of the ARL_MBD tire model, wherein the tire is pushed slowly against a flat surface.
Figures 5, 6, 7:
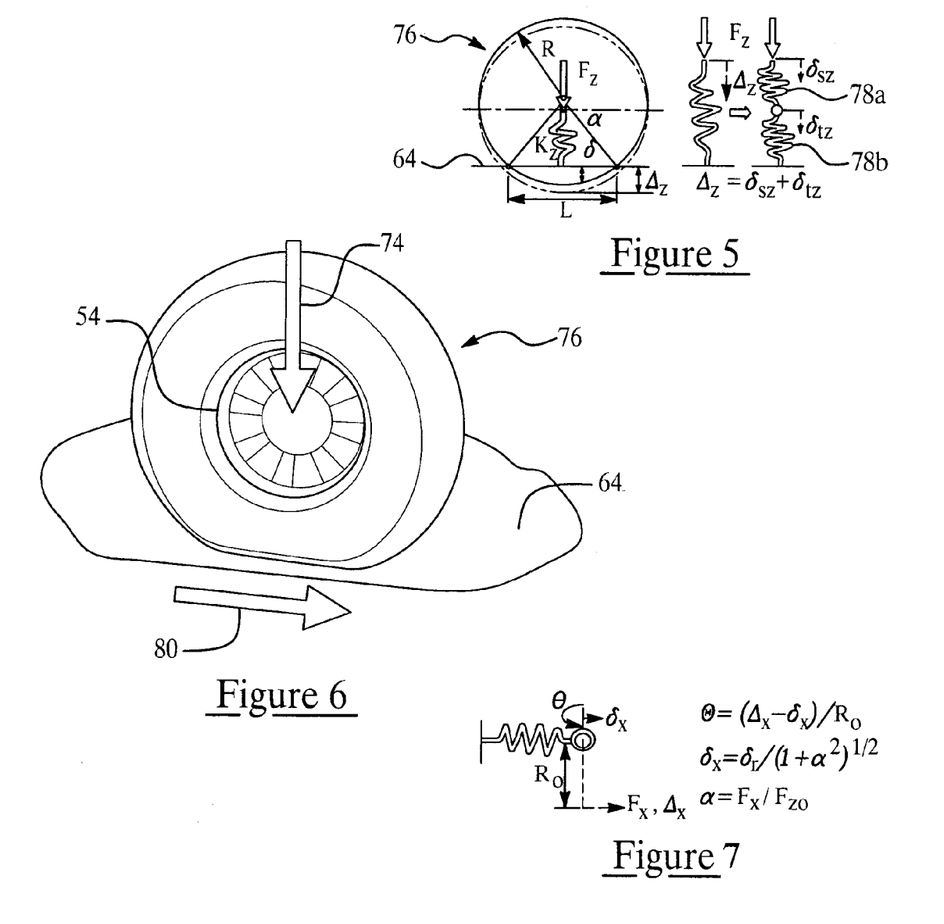
FIG. 5 is a schematic view illustrating an analytical method for identifying non-linear radial stiffness parameters of total tire, sidewall and tread, using data collected with the test set-up shown in FIG. 4.
FIG. 6 is a diagrammatic view showing a quasi-static test set-up used to identify longitudinal and torsional stiffness parameters of the ARL_MBD tire model, wherein the tire is vertically pre-loaded against a moveable flat surface.
FIG. 7 is a schematic view illustrating an analytical method for identifying the total longitudinal and sidewall torsional stiffness parameters using data collected with the test set-up shown in FIG. 6.

Reference is now made to FIGS. 4 and 5 which depict characterization of tire dynamics involving radial stiffness of a tire 76. FIG. 4 shows a quasi-static test set-up used to identify the nonlinear radial or vertical stiffness parameters of the ARL_MBD tire model, wherein the tire 76 is pushed slowly against a flat surface 64. For every incremental vertical displacement, the resulting vertical tire force and contact patch length are recorded. A vertical force (Fz) in the direction of the arrow 74 and contact patch (L) are then measured for each incremental deflection ($\Delta z$).

FIG. 5 illustrates the analytical approach used for the identification of non-linear radial stiffness characteristics of total tire, sidewall and tread. Total tire radial stiffness is represented by two springs 78a, 78b, in series, termed as sidewall and tread. Total deflection ($\Delta_z$) is given as a sum of sidewall deflection ($\delta_{sz}$) and tread deflection ($\delta_{tz}$). Nonlinear tire (total) stiffness characteristics is directly described by the measured data $F_z$ versus $\Delta_z$. Tread deflection ($\Delta_{tz}$) is estimated from the measured contact length (L) and tire un-deflected radius (R), as illustrated in FIG. 5 by the simple geometry. Subsequently, nonlinear tread stiffness characteristics are described by $F_z$ versus $\Delta_{tz}$. Sidewall radial deflection is given by, $\Delta_{sz}=\Delta_z-\Delta_{tz}$. Subsequently, nonlinear sidewall stiffness characteristics are described by $F_z$ versus $\Delta_{sz}$.

FIGS. 6 and 7 depict characterization of tire dynamics involving torsional stiffness. FIG. 6 illustrates a quasi-static test used to identify longitudinal and torsional stiffness parameters of the ARL_MBD tire model. In this test, the tire 76 is pre-loaded with a specified vertical load ($F_{zo}$) on a flat surface in the direction indicated by the arrow 74, and the surface 64 is displaced gradually in the longitudinal direction. Longitudinal force ($F_x$) in the direction of the arrow 80 is then measured for each incremental deflection ($\Delta_x$). The tire rotation is locked. In other words, for every incremental longitudinal displacement, the resulting longitudinal force at the tire center is recorded. This test procedure is performed for a series of vertical pre-loads. Early data in the linear range prior to tire slip is used for the identification purposes.

FIG. 7 illustrates the analytical approach used for the identification of total tire longitudinal and sidewall torsional stiffness characteristics. Tire longitudinal deflection ($\Delta_x$) at the contact patch, which is located at $R_o$ (deflected tire radius under pre-load, $F_{zo}$) under wheel center, is given by the sum of deflections due to sidewall longitudinal and torsional springs. Sidewall radial deflection ($\Delta_r$) under the total in plane radial force ($F_r=(F_x^2+F_{zo}^2)^{1/2}$) is obtained from a pre-established sidewall radial force-deflection curve. Thus, knowing $\delta_r$ and $\alpha$ (in-plane inclination angle) sidewall longitudinal ($\delta_x$) and torsional ($\theta$) deflections are evaluated. Total tire longitudinal stiffness under each vertical pre-load ($F_{zo}$) is directly provided by the measured data $F_x$ versus $\Delta_x$. An average value is considered for the simulation purposes. Sidewall torsional stiffness under each vertical pre-load ($F_{zo}$) is provided the by the torque ($=F_x \cdot R_o$) versus deflection, $\theta$. Torsional stiffness characteristics are then described as being a function of sidewall radial deflection (i.e. to account for the influence of normal load).

Figure 8:
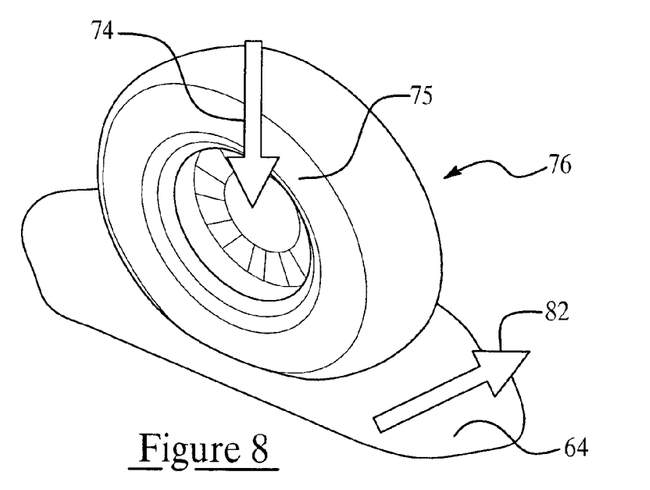
FIG. 8 is a diagrammatic view showing a quasi-static test set-up used to identify the total tire lateral, and sidewall lateral and conical stiffness parameters of the ARL_MBD tire model, wherein the tire is vertically pre-loaded against a moveable surface.
Figures 9, 10, 11:
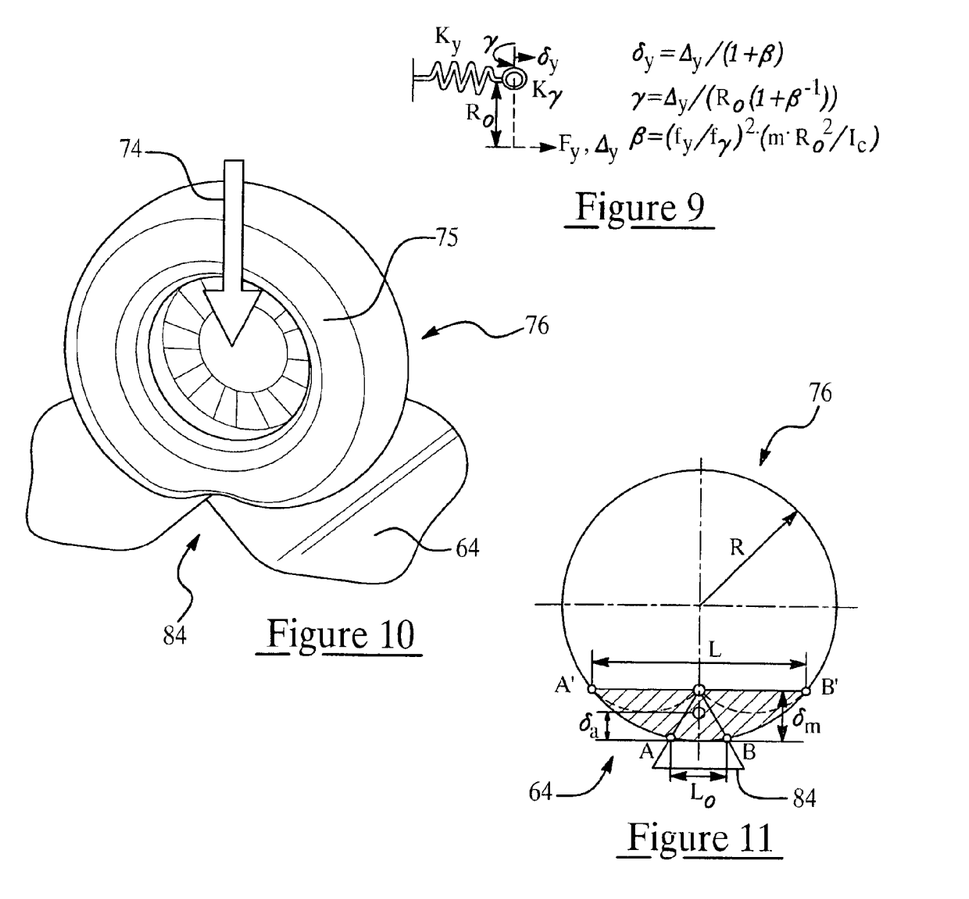
FIG. 9 is a schematic view illustrating an analytical method for identifying the total tire lateral, and sidewall lateral and torsional stiffness parameters using data collected with the test set-up shown in FIG. 8.
FIG. 10 is a diagrammatic view showing a quasi-static test set-up used to identify tire nonlinear radial stiffness characteristics over rough road undulations, wherein the tire is pushed slowly against a triangular wedge.
FIG. 11 is a schematic view illustrating an analytical method for identifying characteristics related to the tire's radial stiffness using data collected with the test set-up shown in FIG. 10.

Reference is now made to FIGS. 8 and 9 which depict characterization of tire dynamics involving lateral and conical stiffness.

FIG. 8 illustrates the quasi-static test used to identify the total tire lateral, and sidewall lateral and conical stiffness parameters of the ARL_MBD tire model. In this test, the tire 76 is pre-loaded with a specified vertical load ($F_{zo}$) 74 on a flat, movable surface 64, and the surface 64 is displaced gradually in a lateral direction indicated by the numeral 82. Lateral force ($F_y$) is then measured for each incremental deflection ($\Delta_y$). The procedure is performed for a series of vertical pre-loads. Early data in the linear range (i.e. prior to tire slip) is used for the identification purposes.

FIG. 9 illustrates the analytical approach used for the identification of total tire lateral, and sidewall lateral and torsional stiffness characteristics. Tire lateral deflection ($\Delta_y$) at the contact patch, which is located at $R_o$ (deflected tire radius under pre-load, $F_{zo}$) under wheel center, is given by the sum of deflections due to sidewall lateral and conical springs. Sidewall lateral ($\delta y$) and conical ($\gamma$) deflections are then expressed as individual functions of total tire lateral deflection at contact patch, $\Delta_y$. The expression for the non-dimensional parameter, $\beta$, is initially based on moment equilibrium in conical direction, and then further derived in terms of tire rigid modal frequencies in lateral ($f_y$) and conical ($f_\gamma$) directions, and tire ring mass (m) and conical inertia ($I_c$). Total tire lateral stiffness under each vertical pre-load ($F_{zo}$) is directly provided by the measured data $F_y$ versus $\Delta_y$. An average value is considered for the simulation purposes. Sidewall lateral and conical stiffness under each vertical pre-load ($F_{zo}$) are provided the by $F_y$ versus $\delta_y$, and $F_y \cdot R_o$ (torque) versus $\gamma$. These stiffness characteristics are then described as being functions of sidewall radial deflection (i.e. to account for the influence of normal load).

Reference is now made to FIGS. 10 and 11 which depict characterization of tire dynamics involving radial stiffness. FIG. 10 illustrates the quasi-static test used to identify tire nonlinear radial stiffness characteristics over rough road undulations, which are used in the ARL_MBD model. In this test, the tire 76 is slowly pushed against a triangular wedge 84, and the force ($F_z$) in the verticle direction 74 is measured for each incremental deflection ($\Delta_z$). This resulting vertical force $F_z$ is measured for every incremental displacement of the tire 76. The test is conducted on five different wedges (half apex angles: 45, 60, 75, 80 & 85 degrees). The measured data is used to describe the deflection shape dependent nonlinear tread stiffness characteristics.

FIG. 11 illustrates the analytical approach used for the identification purpose. The deflection shape function is given as the length ratio ($L_o/L$) versus $\delta_a$. The average deflection ($\delta_a$) is calculated based on the deflected area (hatched), and is given by its centroid location. Nonlinear tread radial stiffness characteristic on a wedge 84 is provided by $F_z$ and $\delta_{tz}$. The tread radial deflection, $\delta_{tz}$, is given as $\delta_a - \delta_{sz}$, where sidewall deflection, $\delta_{sz}$, is estimated for the given $F_z$ from the pre-established force-deflection curve of sidewall on the flat surface. Deflection shape dependent nonlinear stiffness characteristics of tread on wedges as well as flat surface (half apex angle=90 degrees, FIG. 11), are thus defined, and interpolated during simulation to evaluate road-enveloping force.

Figure 12:
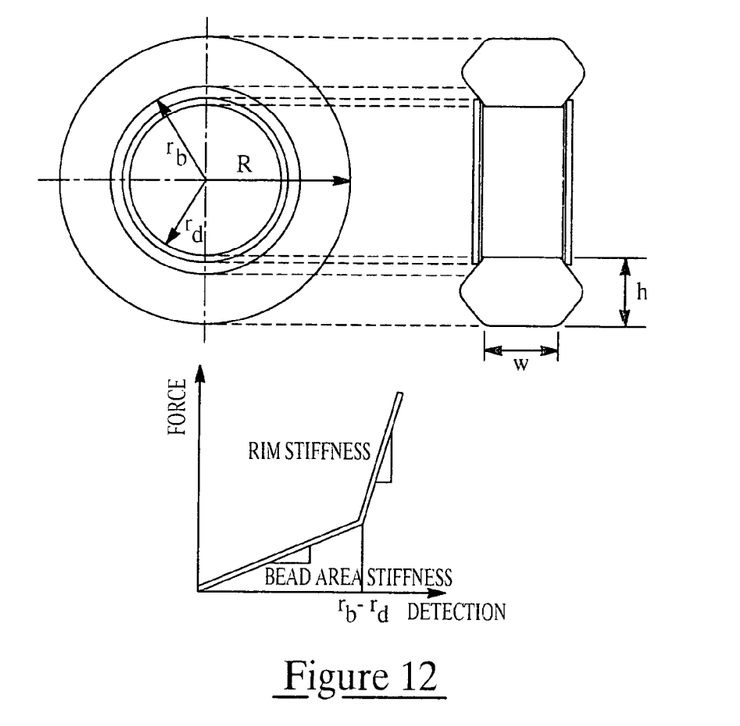
FIG. 12 is a diagrammatic view of the model used in the ARL_MBD to establish the contact between the road and the tire bead/rim under extremely large tire radial deflections.

FIG. 12 illustrates the model used to establish the contact between the road and the tire bead/rim under excessive tire radial deflections. The tire sidewall zone is defined between boundaries defined by the tire overall radius, R, and the effective bead radius, $r_b$. The effective bead area is defined between boundaries defined by $r_b$ and rim radius $r_d$; in this area there is a thickening of tire sidewall which is characterized by the radial bead-area stiffness. Piece-wise linear radial stiffness characteristics are used for evaluating contact force. As shown in the FIG. 12, the rim stiffness is used when the radial deflection exceeds $r_b-r_d$. The contact is established at the two extreme edges.

Figure 13:
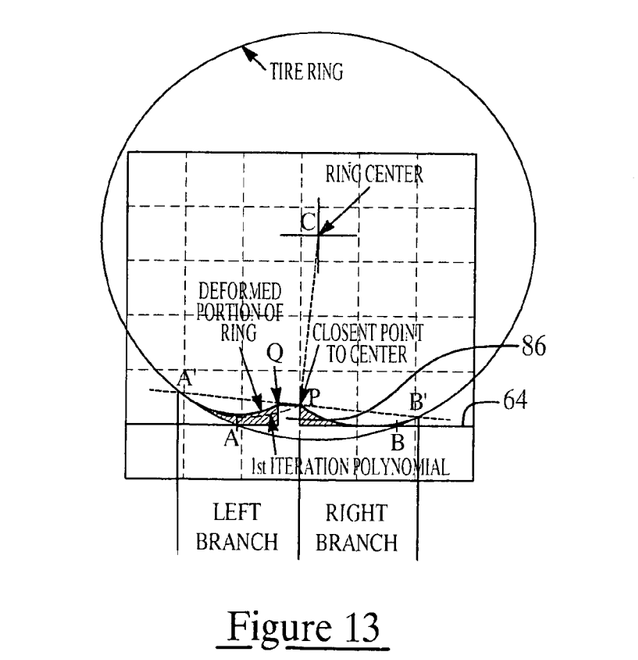
FIG. 13 is a diagrammatic view of the model used in the ARL_MBD to define the tire deformation shape over rough road undulations.

FIG. 13 is a view of the model used in the ARL_MBD to determine the shape of the deformation of the tire ring when the tire is in contact with a road obstacle or rough road undulations. In other words, this figure illustrates elements of the algorithm used to define the shape of the tire 76 enveloping an obstacle. In this figure, a square cleat 86 is used to illustrate a road obstacle. The ring position relative to ground is a known input to the algorithm. First, the intersection between ring and road profile is calculated; this is characterized by the extreme points A and B. Then, a point P is identified that is closest to the ring center C. A line CP is then drawn, and its perpendicular identifies points A' and B' of intersection with the circle. If A' is left to A, A' becomes the new extreme. Similar logic applies for B and B'. Next, the left extreme (A or A') is connected to P using a 2nd order polynomial; this is the first iteration for the left side (or left branch A'P). The same methodology applies to the right side. After the first-iteration polynomial is identified, the second-iteration ring-deformation profile is given by the highest points between the polynomials and the road profile. Then, in each branch, the point of the largest difference between the polynomial and the road profile is identified.

In FIG. 13, Q represents this point for the left branch, and there is no point for the right branch. Point Q divides the left branch into two sub-branches; the same applies to the right side if a point exists on the right branch. Next, the left extreme (A' in this case) is connected to Q using a new 2nd order polynomial. Q is connected to P using another 2nd order polynomial, forming the third iteration. The fourth-iteration ring deformation profile is given by the highest points between the sub-branch polynomials and the road profile. The accuracy of the tire ring deformation model described above can be assessed by driving the tire over a road cleat having a triangular cross section, measuring the shape of the actual deformation of the tire ring and then comparing the shape of the actual deformation with the shape predicted by the model. The deformed shape is finally reduced to an equivalent deformation obtained on a flat and inclined surface. This last step is achieved by identifying the center of the area displayed during the deformation. The center is identified using the same methodology used to calculate the center of mass in bodies with uniform density. The line connecting the displaced area center to the ring center is the line of application of the resultant force due to the deformation. The equivalent flat and inclined surface is the surface that would generate the same force with the same orientation.

Figure 14:
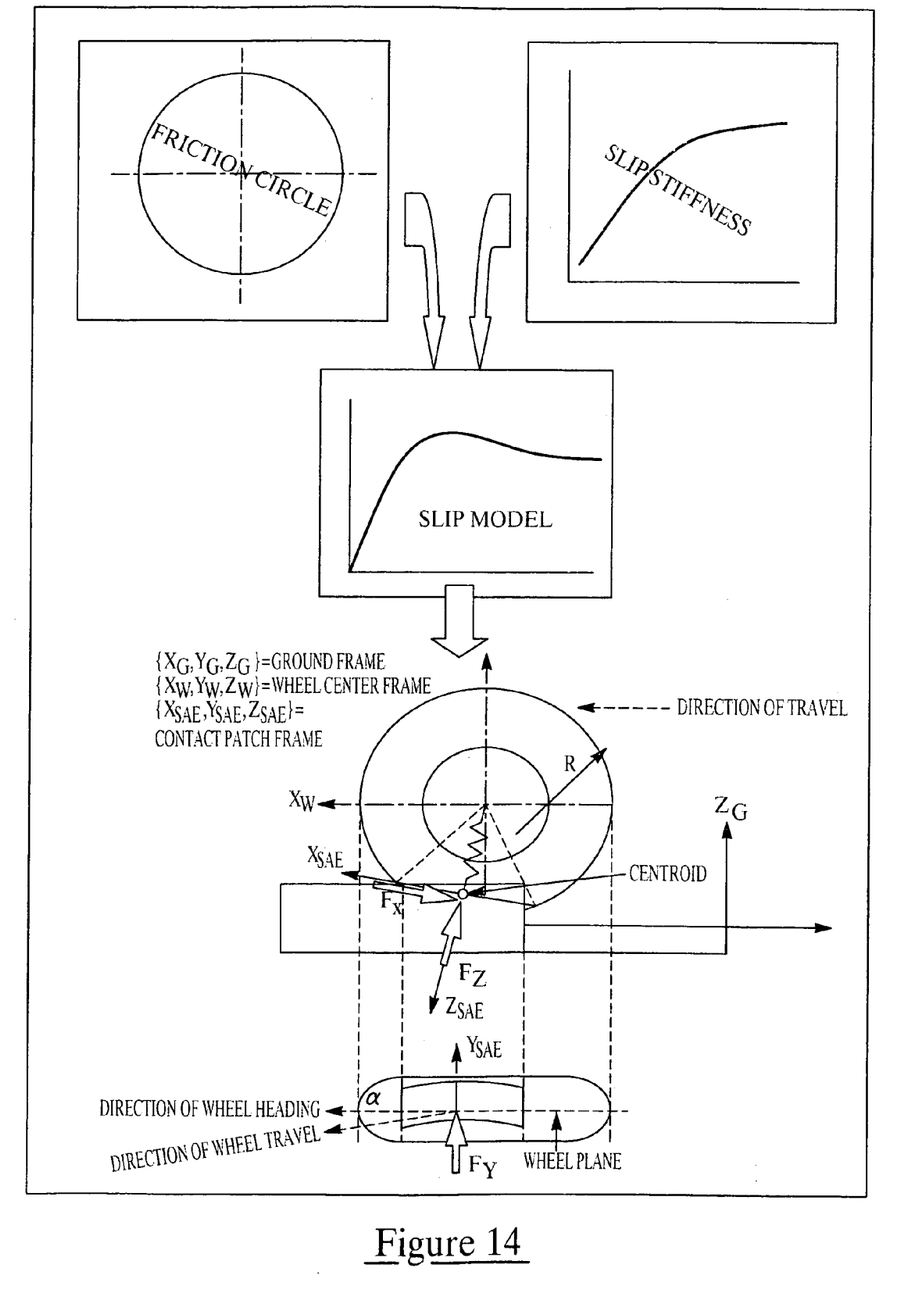
FIG. 14 is a diagrammatic view of the model used in the ARL_MBD to predict longitudinal and lateral slip induced forces.

Referring now to FIG. 14, longitudinal and lateral slip-induced forces are modeled based on the well-established theories available in the prior art literature. The concept of pure slip is used instead of comprehensive slip. The tire-road friction is modeled based on the friction circle concept. The longitudinal slip force due to applied braking/traction and effective rolling-radius variation is modeled considering instantaneous normal load-dependent slip stiffness and tire road friction. The lateral force and self-aligning moment due to driver or road-induced steering angle are modeled considering instantaneous normal load-dependent cornering stiffness and tire-road friction. Tire rolling-resistance is included in the model. Slip forces/moments are applied within the equivalent contact patch, where the center of contact is determined considering displaced contact patch under the in-plane longitudinal and lateral forces.

As will be discussed below, the 3D tire-road contact (either full or partial contact) is modeled using a series of 2D slices, each slice perpendicular to the tire axis of rotation. For each slice the same calculations as shown before are made to determine the deformed shape and the resultant force. This 3D representation accurately depicts the resultant radial force vector, as well as the distributed force vectors and the equivalent plane of contact.

Figure 15:
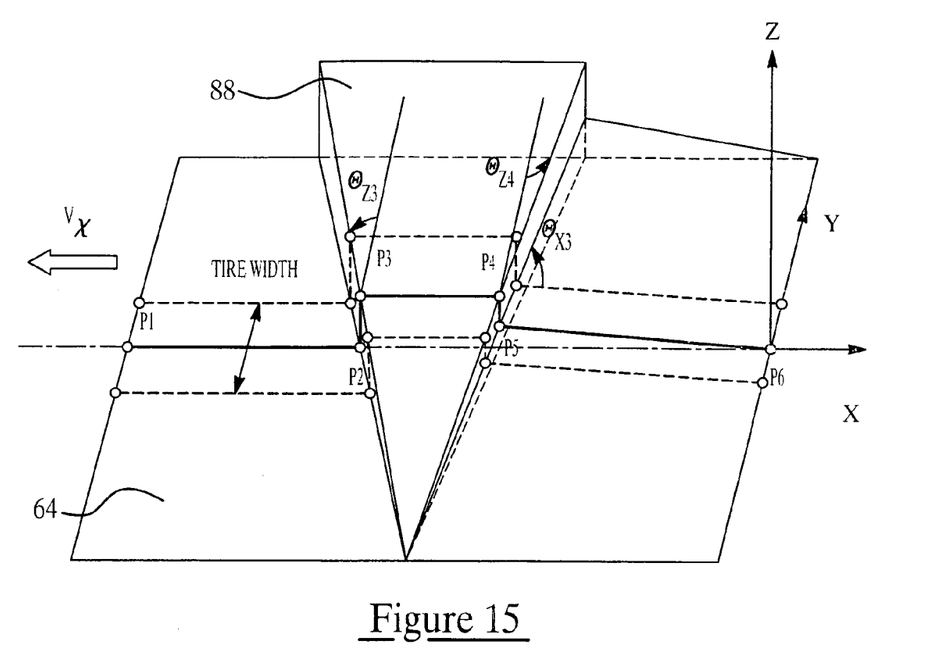
FIG. 15 is a diagram showing a discrete road undulation useful in understanding a first method for modeling road surfaces in ARL_MBD.

Relatively simple but accurate representations of the road surface are then generated using any of the following three methods. The first method assumes discrete undulations in the road surface, as shown in FIG. 15, wherein a single obstacle or undulation 88 is depicted in a road surface 64. The model assumes a given angular orientation of the obstacle 88 relative to the tire at a predefined road slice. Based on these assumptions, road slices across the entire width of the tire 76 can be generated.

Figure 16:
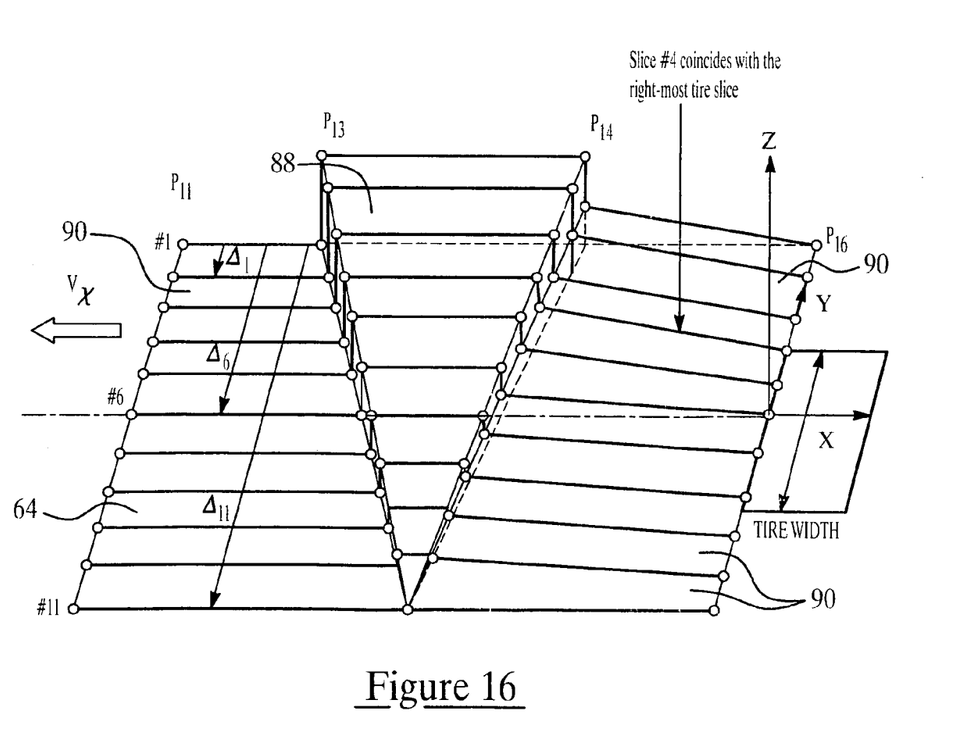
FIG. 16 is a diagram showing a discrete road undulation useful in understanding a second method for modeling road surfaces in ARL_MBD.

Alternatively, as shown in FIG. 16, a global set of road slices 90 defining the entire road surface are employed. Assumptions may be made regarding the lateral position of the tire relative to the obstacle 88, which is not possible using the first method described above.

Figure 17:
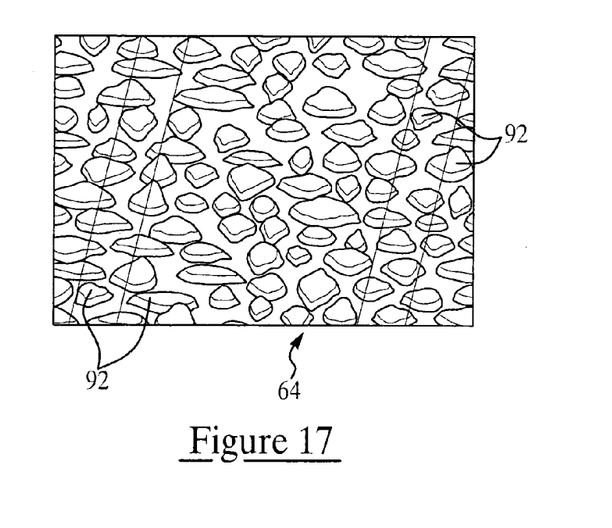
FIG. 17 is a diagram showing random road undulations useful in understanding a third method for modeling road surfaces in ARL_MBD.

Finally, as shown in FIG. 17, a third method may be employed in which it is assumed that the road surface comprises random undulations 92, similar to a cobblestone pattern. Using this method, predefined road slices for each tire track are employed, and preprocessing may be used.

Figure 18:
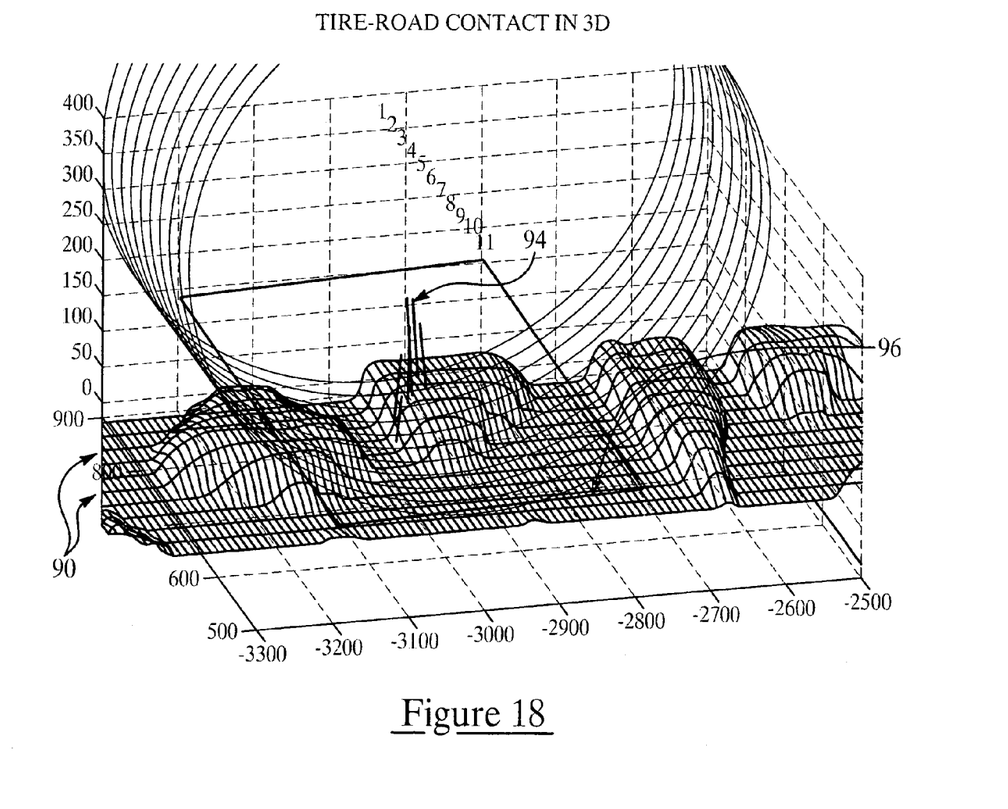
FIG. 18 is a schematic view illustrating how the 3D tire-road contact is modeled using the ARL_MBD tire model.

FIG. 18 shows how the tire-road contact is modeled in 3D. In the illustrated example, the road is defined by random undulations (cobblestones) 92 which are modeled by pre-slicing the road and by defining the profile that corresponds to each slice. Correspondingly, the tire 76 is sliced with slices 90 of the same width. Each slice 90 interacts with the road profile and for each slice 90 a resultant force 94 is calculated (no force is generated for slices 90 that are not in contact with the road). Finally, based on the location and orientation of the forces generated for all slices, a resultant radial force is calculated for the overall tire, and an equivalent plane of contact 96 is determined as well.

The ARL_MBD tire model described above has been found to be quite accurate, in spite of its simplicity. In addition, its simplicity allows for very fast computer simulations, on the order of 10 seconds of CPU time per second of simulation. Significant novel features of the inventive tire model reside in the enveloping algorithm, the variable-radial-stiffness algorithm, the rim-contact algorithm and the 3D enveloping algorithm.

Figure 19:
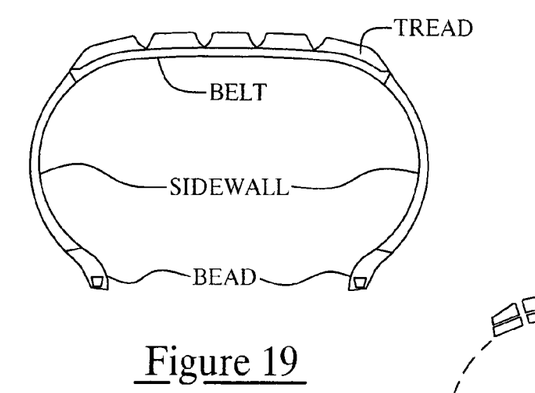
FIG. 19 is a cross sectional view of a tire that has been modeled using finite element techniques.
Figure 20:
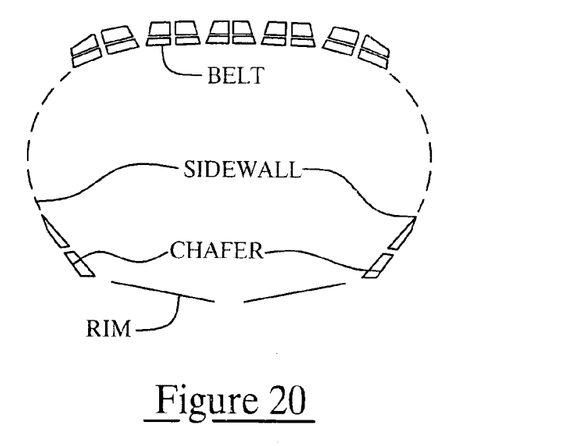
FIG. 20 is a view similar to FIG. 18, but showing the tire having been modeled using simplified finite element techniques employed in the ARL_FE; and, FIG. 21 is a schematic, cross sectional view of a tire, showing key parameters used in the ARL_FE.

The ARL_FE tire model is a finite element model representing a simplification of the highly detailed model used in the Virtual Tire Lab which is represented by the cross sectional tire model shown in FIG. 19. VTL models consist of at least one layer of elements for each layer of material in the physical tire. In general, the belt and sidewall areas of tires consist of 8-10 layers. This leads to a very large number of elements in VTL models, which tends to be an inefficient approach for road load simulations. The ARL_FE tire model of the present invention, which is shown in FIG. 20, replaces the multiple layers by a single layer of shell elements depicted in FIG. 19 with effective material properties derived from all the layers that compose the belt and sidewall. This single layer is formed such that it substantially approximates the physical characteristics of the tire represented by the multiple layers. The constituents of the two FE tire models discussed above are shown in the following table:

|  | Detailed FE Model | Simplified FE Model |
| --- | --- | --- |
| Tread | Solid Elements | Solid Elements |
| Belt/Sidewall | Layers of solid elements with membrane r/f | 1 layer of shell elements with effective properties |
| Bead/Chaffer | Solid elements for rubber and r/f | Solid elements for rubber and rigid shell for r/f |

Figure 21:
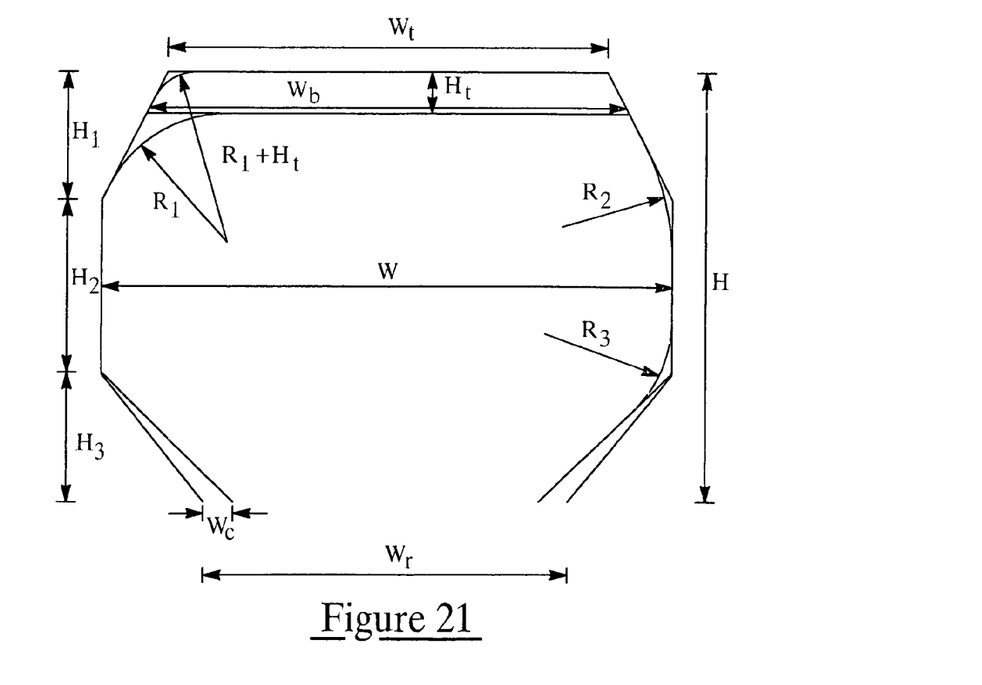

Building the ARL FE tire model comprises two steps. The first step involves building the cross section geometry of the tire to closely follow the VTL model shown in FIG. 21. The parametric geometry shown in FIG. 21 was developed to facilitate this process. The independent and dependent parameters for the parametric tire section shown in FIG. 21 are as follows:

Independent Parameters
H—Overall height
W—Overall width $H_t$—Tread height
$W_r$—Rim width
$W_t$—Tread width
$H_1$—Tread/Sidewall taper height
$H_3$—Rim/Sidewall taper height
R—Rim radius
$t_s$—Sidewall thickness (average)
$t_b$—Belt thickness (average)
$W_c$—Chafer width Dependent Parameters
$H_2 = H - H_1 - H_3$
$\theta_1 = \tan^{-1}(2H_1/(W-W_r))$
$\theta_2 \tan^{-1}(2H_3/(W-W_r+2W_c))$
$W_b = W - 2(H_1-H_t)/\tan\theta_1$
$R_1 \leq \min\{(H_1-H_t)/(1-\cos\theta_1)/2, W_b \sin\theta_1/(1-\cos\theta_1)/2\}$
$R_2 \leq \min\{(W-W_b)/(1-\sin\theta_1)/4, H_2 \cos\theta_1/(1-\sin\theta_1)/2\}$
$R_3 \leq \min\{(W-W_r+2W_c)/(1-\sin\theta_2)/4, H_2 \cos\theta_2/(1-\sin\theta_2)/2\}$ The second step of the method involves the calculation of the effective properties for the belt and sidewall. Despite the fact that the behavior of rubber is hyperelastic due to the fiber reinforcement, the assumption is made that the overall behavior of belt and sidewall is linear elastic. Hence, the hyperelastic properties of the rubber layers are first converted into linear elastic. For the fiber-reinforced layers, the elastic compliances are constructed based on the effective properties of an n-layered beam. These properties are as follows:

Axial Stiffness $$Et = \sum_{i=1}^{n} E_i t_i \quad (1)$$

Bending Stiffness $$Et^3 = \sum_{i=1}^{n} E_i t_i (12 c_i + t_i^2) \quad (2)$$

Shear Stiffness $$Gt = \sum_{i=1}^{n} G_i t_i \quad (3)$$

Poisson Effect $$v_{12} t = \sum_{i=1}^{n} v_{12}^i t_i \quad (4)$$

Mass $$\rho t = \sum_{i=1}^{n} \rho_i t_i \quad (5)$$

For the obliquely reinforced layers, these compliances are resolved in the axes of orthotropy of the tire, which are defined as follows:

| Direction | Belt | Sidewall |
|---|---|---|
| 1 | Circumferential Direction of the Tire | Radial Direction Projected onto the Surface |
| 2 | Axial Direction Projected on to the Surface | Circumferential Direction of the Tire |

Once the compliances are resolved for all the layers, the effective properties of the belt and sidewall are evaluated. These effective properties are as follows:
1. Effective Young's modulus in direction 1 and effective thickness are evaluated from equations (1) and (2) above.
2. Then, the effective shear modulus, Poisson's ratio and density are evaluated from equations (3), (4) and (5) above, respectively.
3. the effective Young's modulus in direction 2 is the average of the values given by equations (1) and (2).

The orthotropic-elastic compliance in plane stress condition is given by the equation:

$$\begin{Bmatrix} e_{11} \\ e_{22} \\ e_{12} \end{Bmatrix} = \begin{bmatrix} \frac{1}{E_1} & \frac{-v}{E_1} & 0 \\ \frac{-v}{E_1} & \frac{1}{E_2} & 0 \\ 0 & 0 & \frac{1}{2G} \end{bmatrix} \begin{Bmatrix} s_{11} \\ s_{22} \\ s_{12} \end{Bmatrix}$$

$e_{11}, e_{22}, e_{12}$ – In-plane strain components
$s_{11}, s_{22}, s_{12}$ – In-plane stress components There are layers in the tire belt whose axes of orthotropy do not coincide with those of the belt. Accordingly, the assumption is made that for any obliquely reinforced layer of belt, there is a counterpart, and the axes of orthotropy of both layers together coincide with those of the belt.

Compliance of obliquely reinforced layers is resolved using the following relationships:

Elasticity in the coordinate system of the layer is given by:

$\{e'\}=[D]\{s'\}$

Elasticity in the coordinate systems of the belt is given by:

$\{e\}=[\overline{D}]\{s\}$ $[\overline{D}]=[T_1][D][T_2]$

Resolved moduli along the axes of the belt are:

$E_1 = 1/D_{11}, E_2 = 1/D_{22}, v = -D_{21}/D_{11}, G = 1/2D_{33}$

The transformation matrices are:

$\{e\} = [T_1]\{e'\}, \{s'\} = [T_2]\{s\}$ $$[T_1] = \begin{bmatrix} c^2 & s^2 & 2cs \\ s^2 & c^2 & -2cs \\ -cs & cs & c^2-s^2 \end{bmatrix},$$

$$[T_2] = \begin{bmatrix} c^2 & s^2 & -2cs \\ s^2 & c^2 & 2cs \\ cs & -cs & c^2-s^2 \end{bmatrix},$$

$c = \cos\theta,$
$s = \sin\theta$ where $\theta$ is the angle between the two coordinate systems.

In the preferred embodiment, a graphical user interface GUI is employed to guide and support the user in utilizing the ARL. The GUI may be a Matlab based GUI. Matlab is a commercially available software tool for performing numerical computations with matrices and vectors, and for displaying information graphically. The GUI has three main functions. First, it allows the user to easily run virtual tire tests in the VTL environment (i.e. using ABAQUS). Second, based on responses obtained from these virtual tests, the GUI can extract the tire parameters needed to build the ARL MBD model for multibody simulations. Third, the GUI can automatically the ARL FE model from the very detailed VTL model for FE simulations.

It is to be understood that the system, which has been described are merely illustrative of one application of the principles of the invention. Numerous modifications may be made to the device of the method as described without departing from the true spirit and scope of the invention.

What is claimed is:

1. A method for predicting road loads on vehicle components and systems, comprising the steps of:
    using a graphical user interface (GUI) to transform physical tire characteristics into software parameters, wherein the step of using the GUI includes
    (A) inputting software parameters into the GUI;
    (B) producing a set of data from the software parameters input into the GUI defining preselected physical characteristics of a tire on the vehicle;
    (C) generating an analytical model of the tire using the data produced in step (A); and,
    (D) simulating road loads on the vehicle using the analytical tire model generated in step (B).

2. The method of claim 1, wherein step (C) includes performing virtual tests on the tire using nonlinear finite element simulations and the data set provided in step (B), and recording responses to the virtual tests.

3. The method of claim 2, wherein the tests include at least one of the following tests: tire mass and inertias calculation, modal frequency tests, three directional quasi-static flat-plate tests, vertical wedge tests, longitudinal slip tests, and lateral or side slip tests.

4. The method of claim 2, wherein the recorded responses include wedge quasi-static force deflection data in the radial direction of the tire.

5. The method of claim 3, wherein the recorded responses further include at least one of the following: tire mass and inertias; modal frequencies, contact patch lengths on a flat-surface, flat-surface quasi-static force-deflection data in the X, Y & Z-directions, flat-surface dynamic force-slip data in X-direction, flat-surface dynamic Y-force and aligning moment compared to slip angle data.

6. The method of claim 1, wherein step (C) includes modeling the contact between the tire and the road in three dimensions, and the modeling is performed by
    calculating a plurality of two dimensional slices of the contact between the road and the tire, wherein each of the slices is perpendicular to the axis or rotation of the tire,
    determining the shape of the deformation of the tire due to contact with the road, and,
    determining the resultant force between the tire and the road.

7. The method of claim 1, wherein step (C) includes modeling the contact between the tire and the road in three dimensions based on random undulations in the road surface, wherein the modeling includes
    generating a profile of each of a plurality of undulations in the road,
    generating a plurality of slices of the tire that will interact with a corresponding one of the profiled undulations,
    calculating the resultant force imposed on each the tire slice by the corresponding profiled undulation, and
    calculating an overall resultant contact force imposed on the tire using the calculated resultant forces imposed on the tire slices.

8. The method of claim 2, wherein step (C) includes simplifying the finite element description by selectively reducing the number of characteristics of the tire used to generate the analytical tire model.

9. The method of claim 8, wherein the set of data defining the physical characteristics of the tire includes multiple layers of elements corresponding to multiple layers of material in the tire, and the selective reduction of the number of characteristics is performed by reducing the number of layers of elements to a single layer that substantially approximates the physical tire characteristics.

10. The method of claim 8, wherein reduction of the number of characteristics includes using parametric geometry to describe the cross section of the tire, and selecting tire characteristics matching features of the cross section described by the parametric geometry.

11. A method for generating a tire model for use in multibody simulations for vehicles, comprising the steps of:
    using a graphical user interface (GUI) to transform physical tire characteristics into software parameters, wherein the step of using the GUI includes
    (A) inputting software parameters into the GUI;
    (B) producing a set of data defining preselected physical characteristics of the tire; and,
    (C) developing a set of analytical road load tire parameters describing the tire model, using nonlinear finite element simulations and the data produced in step (B).

12. The method of claim 11, wherein the finite element simulations include generating data defining quasi-static force deflection of the tire in radial direction of the tire resulting from tire contact with a wedge shaped surface.

13. The method of claim 11, wherein the finite element simulations include determining the longitudinal and torsional stiffness of the tire by simulating the preload of the tire on a flat surface with a preselected vertical load, longitudinally displacing the surface, measuring the longitudinal force for each incremental deflection of the tire, and recording the longitudinal force at the center of the tire.

14. The method of claim 11, wherein the finite element simulations include determining the total lateral and sidewall lateral and conical stiffness parameters of the tire by preloading the tire with a preselected vertical load on a flat movable surface, incrementally displacing the flat surface laterally relative to the tire, and measuring the lateral force on the tire for each incremental deflection of the tire.

15. The method of claim 11, wherein the finite element simulations include determining the dynamic radial stiffness of the tire by forcing the tire against a triangular wedge, measuring the force in the vertical direction for each incremental deflection of the tire.

16. A method of building a virtual road load model for designing vehicles, comprising the steps of:
    using a graphical user interface (GUI) to transform physical tire characteristics into software parameters, wherein the step of using the GUI includes
    (A) inputting software parameters into the GUI;
    (B) generating a virtual model of a vehicle tire having a set of known characteristics;
    (C) modeling the response of the virtual model tire to a set of predetermined road conditions; and
    (D) developing the road load model using the response modeled in step (C).

17. The method of claim 16, wherein step (B) includes representing the dynamics of the virtual model tire using multiple rigid body modes, and the rigid body modes include radial, torsional, lateral and steering direction.

18. The method of claim 16, wherein step (B) includes characterizing the sidewall stiffness of the virtual model tire in a plurality of directions.

19. The method of claim 16, wherein step (B) includes 3D modeling of the interaction of the virtual model tire with a rough road, wherein the 3D modeling of the interaction is performed using discrete undulations in the road.

20. The method of claim 16, wherein step (D) includes determining the shape of the in-plane deflection of the tire due to engagement of the tire with a non-deformable road surface obstacle using second order polynomials approximations.

* * * * *